(12) United States Patent
Nakatani

(10) Patent No.: US 6,188,258 B1
(45) Date of Patent: Feb. 13, 2001

(54) CLOCK GENERATING CIRCUITRY

(75) Inventor: Takashi Nakatani, Hyogo (JP)

(73) Assignees: Mitsubishi Electric System LSI Design Corporation, Itami; Mitsubishi Denki Kabushiki Kaisha, Tokyo, both of (JP)

(*) Notice: Under 35 U.S.C. 154(b), the term of this patent shall be extended for 0 days.

(21) Appl. No.: 09/285,684

(22) Filed: Apr. 5, 1999

(30) Foreign Application Priority Data

Nov. 27, 1998 (JP) .................................................. 10-338181

(51) Int. Cl.⁷ ....................................................... H03L 7/06
(52) U.S. Cl. ........................ 327/157; 327/156; 327/113; 327/115; 327/116; 327/119
(58) Field of Search ........................ 327/113–119, 291, 327/294, 156–159, 299; 331/17–18, 25; 377/47–48

(56) References Cited

U.S. PATENT DOCUMENTS

| 3,778,726 | * | 12/1973 | Kucera | 327/116 |
| 5,142,247 | * | 8/1992 | Lada, Jr. et al. | 331/25 |
| 5,281,863 | * | 1/1994 | Bond et al. | 327/114 |
| 5,309,429 | * | 5/1994 | Fukuda | 370/280 |
| 5,457,424 | * | 10/1995 | McGinn et al. | 329/306 |
| 5,696,950 | * | 12/1997 | Ichinose et al. | 395/556 |
| 5,952,890 | * | 9/1999 | Fallisgaard et al. | 331/18 |
| 6,005,420 | * | 12/1999 | Yoshizawa et al. | 327/116 |
| 6,049,238 | * | 4/2000 | Shimizu et al. | 327/156 |

FOREIGN PATENT DOCUMENTS

| 7-336217 | 12/1995 | (JP) . |
| 10-56382 | 2/1998 | (JP) . |

\* cited by examiner

*Primary Examiner*—Terry D. Cunningham
*Assistant Examiner*—Long Nguyen
(74) *Attorney, Agent, or Firm*—Burns, Doane, Swecker & Mathis, LLP

(57) ABSTRACT

Clock generating circuitry comprises a first frequency multiplier for multiplying the frequency of a reference clock applied thereto by 2n, where n is a natural integer, and for furnishing the frequency-multiplied clock, a frequency divider for dividing the frequency of the frequency-multiplied clock furnished by the first frequency multiplier by 227, and for furnishing the frequency-divided clock, and a second frequency multiplier for multiplying the frequency of the frequency-divided clock from the frequency divider by 128, and for furnishing the frequency-multiplied clock. The reference clock can have a frequency of about 4.43 MHz.

8 Claims, 3 Drawing Sheets

CLOCK GENERATING CIRCUITRY

BACKGROUND OF THE INVENTION

1. Field of the Invention

The present invention relates to clock generating circuitry for generating a plurality of clocks of different frequencies that differ from the frequency of a reference clock applied thereto.

2. Description of the Prior Art

Referring now to FIG. 3, there is illustrated a block diagram showing the structure of prior art clock generating circuitry. In the figure, reference numeral 1 denotes a phase comparator for comparing the phase of a reference clock fsc applied thereto with that of a frequency-divided clock generated by a frequency divider 5, 2 denotes a charge pump circuit for generating a series of pulses according to the comparison result from the phase comparator 1, and 3 denotes a low-pass filter for attenuating high-frequency components of each of the series of pulses from the charge pump circuit 2 and for furnishing all other low-frequency components to a voltage-controlled oscillator 4. The voltage-controlled oscillator 4 oscillates so as to produce a frequency-multiplied clock of a certain frequency that is proportional to a voltage applied thereto by the low-pass filter 3.

The frequency divider 5 divides the frequency of the frequency-multiplied clock from the voltage-controlled oscillator 4 by 256, and then furnishes the frequency-divided clock to the phase comparator 1. Reference numeral 6 denotes a second frequency divider for dividing the frequency of the frequency-multiplied clock from the voltage-controlled oscillator 4 by 128, and for furnishing the frequency-divided clock as a first clock, and 7 denotes a third frequency divider for dividing the frequency of the frequency-multiplied clock from the voltage-controlled oscillator 4 by 227, and for furnishing the frequency-divided clock as a second clock.

In operation, in the case that PAL is adopted as a television system, there is a need to generate a clock for video signal generation and another clock for VPS (text broadcasting or teletext used in Europe), and the chrominance subcarrier for PAL whose frequency is about 4.43 MHz is used as the reference clock fsc.

When the phase comparator 1 receives the reference clock fsc whose frequency is about 4.43 MHz, it compares the phase of the reference clock fsc with that of the frequency-multiplied clock furnished by the voltage-controlled oscillator 4 so as to make them be in phase with each other. When the phase of the reference clock fsc is delayed with respect to that of the frequency-multiplied clock, the charge pump 2 generates one or more low-state pulses throughout a period during which the phase delay lasts, that is, until their phases are made to be in phase with each other, so as to introduce phase lag into the frequency-multiplied clock. The low-pass filter 3 then attenuates high-frequency components of each low-state pulse from the charge pump, and lowers its voltage that will be applied to the voltage-controlled oscillator 4. As a result, the voltage-controlled oscillator 4 can delay the phase of its output. Finally, the frequency-multiplied clock from the voltage-controlled oscillator 4 is made to be in phase with the reference clock fsc.

In contrast, when the phase of the reference clock fsc leads that of the frequency-multiplied clock from the voltage-controlled oscillator 4, the charge pump 2 generates one or more high-state pulses throughout a period during which the phase lead lasts, that is, until their phases are made to be in phase with each other, so as to introduce phase lead into the frequency-multiplied clock. The low-pass filter 3 attenuates high-frequency components of each high-state pulse from the charge pump, and raises its voltage that will be applied to the voltage-controlled oscillator 4. As a result, the voltage-controlled oscillator 4 can introduce phase lead into its output. Finally, the frequency-multiplied clock from the voltage-controlled oscillator 4 is made to be in phase with the reference clock fsc.

In this manner, the voltage-controlled oscillator 4 generates a frequency-multiplied clock whose frequency depends on the output voltage of the low-pass filter 3. The frequency-multiplied clock generated by the voltage-controlled oscillator 4 can have a frequency 256 times (about 1.1 GHz) as high as that (about 4.43 MHz) of the reference clock fsc only if the frequency-multiplied clock is in phase with the reference clock fsc.

When the voltage-controlled oscillator 4 oscillates to generate the frequency-multiplied clock having a frequency of about 1.1 GHz, the second frequency divider 6 generates a clock of a frequency two times as high as that of the reference clock fsc (the video signal requires a clock of a frequency two times as high as that of the reference clock fsc because color information is piggybacked onto the video signal by phase-modulating the chrominance subcarrier). In other words, the second frequency divider 6 divides the frequency of the frequency-multiplied clock from the voltage-controlled oscillator by 128 so as to generate the first clock whose frequency is about 8.86 Mhz (1.1 GHz/128 is nearly equal to 8.86 MHz).

When the voltage-controlled oscillator 4 oscillates to generate the frequency-multiplied clock having a frequency of about 1.1 GHz, the third frequency divider 7 generates a clock of a frequency 320 times as high as that of the horizontal synchronizing signal (15.625 MHz) (VPS signal requires a clock of a frequency 320 times as high as that of the horizontal synchronizing signal). In other words, the third frequency divider 7 divides the frequency of the frequency-multiplied clock from the voltage-controlled oscillator by 227 so as to generate the second clock whose frequency is about 5.00 MHz (1.1 GHz/227 is nearly equal to 5.00 MHz).

Japanese Patent Application Publication (KOKAI) No. 7-336217 discloses an apparatus in which a first PLL, a frequency divider, and a second PLL are connected in series to reduce the time required to lock up the PLLs and improve the stability of the locking of the PLLs. However, the apparatus does not employ the PAL system as a television system, and the reference does not disclose a technique for setting a ratio of frequency division in each circuit to a proper value.

A problem with such prior art clock generating circuitry so constructed as mentioned above is that although the voltage-controlled oscillator 4 can theoretically generate a clock for video signal generation and another clock for VPS by dividing the frequency of the reference clock fsc by 256, it is actually difficult to provide such the voltage-controlled oscillator that can generate a frequency-multiplied clock of a very high frequency (for example, about 1.1 GHz).

SUMMARY OF THE INVENTION

The present invention is made to overcome the above problem. It is therefore an object of the present invention to provide clock generating circuitry capable of generating a clock for video signal generation that is needed when adopting PAL system, without having to use a voltage-controlled oscillator intended for generating a multiplied clock of a very high frequency.

In accordance with one aspect of the present invention, there is provided clock generating circuitry comprising: a first frequency multiplier for multiplying the frequency of a reference clock applied thereto by 2n, where n is a natural integer, and for furnishing the frequency-multiplied clock; a frequency divider for dividing the frequency of the frequency-multiplied clock furnished by the first frequency multiplier by 227, and for furnishing the frequency-divided clock; and a second frequency multiplier for multiplying the frequency of the frequency-divided clock from the frequency divider by 128, and for furnishing the frequency-multiplied clock. The reference clock can have a frequency of about 4.43 MHz.

In accordance with another aspect of the present invention, there is provided clock generating circuitry comprising: a first frequency multiplier for multiplying the frequency of a reference clock applied thereto by 2n, where n is a natural integer, and for furnishing the frequency-multiplied clock; a frequency divider for dividing the frequency of the frequency-multiplied clock furnished by the first frequency multiplier by 193, and for furnishing the frequency-divided clock; and a second frequency multiplier for multiplying the frequency of the frequency-divided clock from the frequency divider by 151, and for furnishing the frequency-multiplied clock. The reference clock can have a frequency of about 4.43 MHz.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
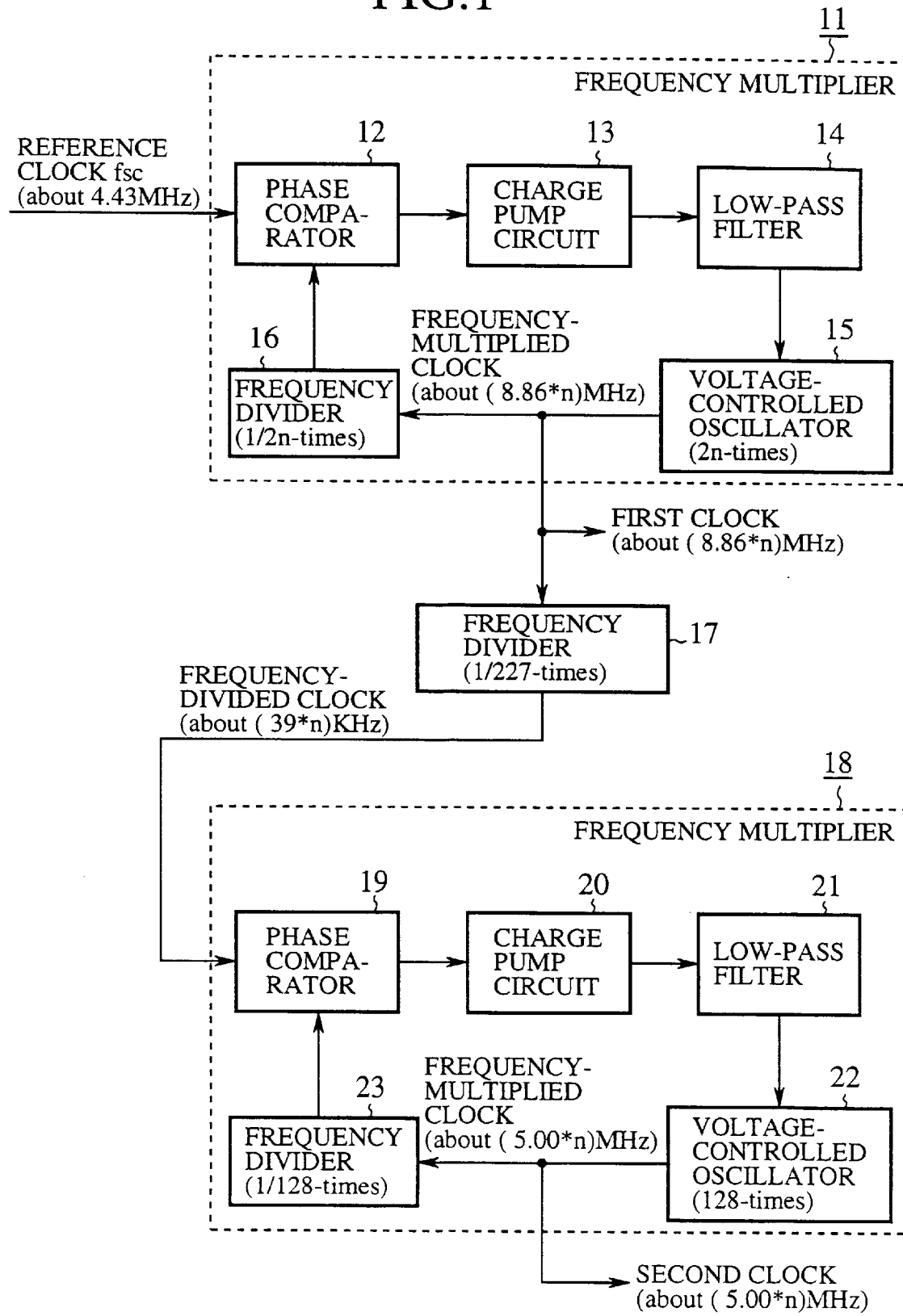
FIG. 1 is a block diagram showing the structure of clock generating circuitry according to a first embodiment of the present invention.

Referring next to FIG. 1, there is illustrated a block diagram showing the structure of clock generating circuitry according to a first embodiment of the present invention. In the figure, reference numeral 11 denotes a first frequency multiplier for multiplying the frequency of a reference clock fsc applied thereto by 2n, where n is a natural integer, and for furnishing the frequency-multiplied clock as a first clock, 12 denotes a phase comparator for comparing the phase of the reference clock fsc with that of a frequency-divided clock generated by a first frequency divider 16, 13 denotes a charge pump circuit for generating one or more pulses according to the comparison result from the phase comparator 12, and 14 denotes a low-pass filter for attenuating high-frequency components of each pulse from the charge pump circuit 13 and for furnishing all other low-frequency components to a voltage-controlled oscillator 15. The voltage-controlled oscillator 15 produces a frequency-multiplied clock of a certain frequency that is proportional to an output potential of the low-pass filter 14. Further, the first frequency divider 16 divides the frequency of the frequency-multiplied clock from the voltage-controlled-oscillator 15 by 2n, and then furnishes the frequency-divided clock to the phase comparator 12.

Reference numeral 17 denotes a second frequency divider for dividing the frequency of the frequency-multiplied clock from the voltage-controlled oscillator 15 of the first frequency multiplier 11 by 227, and for furnishing the frequency-divided clock, 18 denotes a second frequency multiplier for multiplying the frequency of the frequency-divided clock from the second frequency divider 17 by 128, and for furnishing the frequency-multiplied clock as a second clock, 19 denotes a phase comparator for comparing the phase of the frequency-divided clock from the second frequency divider 17 with that of a frequency-divided clock generated by a third frequency divider 23, 20 denotes a charge pump circuit for generating one or more pulses according to the comparison result from the phase comparator 19, and 21 denotes a low-pass filter for attenuating high-frequency components of each pulse from the charge pump circuit 20 and for furnishing all other low-frequency components to a voltage-controlled oscillator 22. The voltage-controlled oscillator 22 produces a frequency-multiplied clock of a certain frequency that is proportional to an output potential of the low-pass filter 21. Further, the third frequency divider 23 divides the frequency of the frequency-multiplied clock from the voltage-controlled-oscillator 22 by 128, and then furnishes the frequency-divided clock to the phase comparator 19.

In operation, in the case that PAL is adopted as a television system, there is a need to generate a clock for video signal generation and another clock for VPS (text broadcasting or teletext used in Europe), and the chrominance subcarrier for PAL whose frequency is about 4.43 MHz is used as the reference clock fsc.

When the phase comparator 12 of the first frequency multiplier 11 receives the reference clock fsc whose frequency is about 4.43 MHz, it compares the phase of the reference clock fsc with that of the frequency-divided clock generated by the first frequency divider 16, i.e. that of the frequency-multiplied clock furnished by the voltage-controlled oscillator 15 so as to make them be in phase with each other. When the phase of the reference clock fsc is delayed with respect to that of the frequency-multiplied clock, the charge pump 13 generates one or more low-state pulses throughout a period during which the phase delay lasts, that is, until their phases are made to be in phase with each other, so as to introduce phase lag into the frequency-multiplied clock. The low-pass filter 14 attenuates high-frequency components of each low-state pulse, and lowers its voltage that will be applied to the voltage-controlled oscillator 15. As a result, the voltage-controlled oscillator 15 can delay the phase of its output. Finally, the frequency-multiplied clock from the voltage-controlled oscillator 15 is made to be in phase with the reference clock fsc.

In contrast, when the phase of the reference clock fsc leads that of the frequency-multiplied clock from the voltage-controlled oscillator 15, the charge pump 13 generates one or more high-state pulses throughout a period during which the phase lead lasts, that is, until their phases are made to be in phase with each other, so as to introduce phase lead into the frequency-multiplied clock. The low-pass filter 14 attenuates high-frequency components of each high-state pulse, and raises its voltage that will be applied to the voltage-controlled oscillator 15. As a result, the voltage-controlled oscillator 15 can introduce phase lead into its output. Finally, the frequency-multiplied clock from the voltage-controlled oscillator 15 is made to be in phase with the reference clock fsc.

In this manner, the voltage-controlled oscillator 15 generates a frequency-multiplied clock whose frequency depends on the output voltage of the low-pass filter 14. The first frequency-multiplied clock can have a frequency 2n times (about (8.86*n)MHz) as high as that (about 4.43 MHz) of the reference clock fsc only if the frequency-multiplied clock is in phase with the reference clock fsc. The first clock thus has a frequency of about (8.86*n)MHz. n can have any value that is a natural integer. Note that the larger n the finer phase modulation can be carried out.

When the second frequency divider 17, which is intended to reduce the multiplier given by the voltage-controlled oscillator 15 of the first frequency multiplier 11, receives the frequency-multiplied clock whose frequency is about (8.86*n)MHz from the voltage-controlled oscillator 15 of the first frequency multiplier 11, it divides the frequency of the frequency-multiplied clock by 227 and then furnishes the frequency-divided clock having a frequency of about (39*n) kHz.

When the phase comparator 19 of the second frequency multiplier 18 receives the frequency-divided clock whose frequency is about (39*n)kHz, it compares the phase of the frequency-divided clock from the second frequency divider 17 with that of the frequency-divided clock generated by the third frequency divider 23, i.e. that of the frequency-multiplied clock furnished by the voltage-controlled oscillator 22 so as to make them be in phase with each other. When the phase of the frequency-divided clock from the second frequency divider 17 is delayed with respect to that of the frequency-multiplied clock, the charge pump 20 generates one ore more low-state pulses throughout a period during which the phase delay lasts, that is, until their phases are made to be in phase with each other, so as to introduce phase lag into the frequency-multiplied clock. The low-pass filter 21 attenuates high-frequency components of each low-state pulse, and lowers its voltage that will be applied to the voltage-controlled oscillator 22. As a result, the voltage-controlled oscillator 22 can delay the phase of its output. Finally, the frequency-multiplied clock from the voltage-controlled oscillator 22 is made to be in phase with the frequency-divided clock from the second frequency divider 17.

In contrast, when the phase of the frequency-divided clock from the second frequency divider 17 leads that of the frequency-multiplied clock from the voltage-controlled oscillator 22, the charge pump 20 generates one or more high-state pulses throughout a period during which the phase lead lasts, that is, until their phases are made to be in phase with each other, so as to introduce phase lead into the frequency-multiplied clock. The low-pass filter 21 attenuates high-frequency components of each high-state pulse, and raises its voltage that will be applied to the voltage-controlled oscillator 22. As a result, the voltage-controlled oscillator 22 can introduce phase lead into its output. Finally, the frequency-multiplied clock from the voltage-controlled oscillator 22 is made to be in phase with the frequency-divided clock from the second frequency divider 17.

In this manner, the voltage-controlled oscillator 22 generates the frequency-multiplied clock whose frequency depends on the output voltage of the low-pass filter 21. The frequency-multiplied clock can have a frequency 128 times (about (5.00*n)MHz) as high as that (about (39*n)kHz) of the frequency-divided clock from the second frequency divider 17 only if the frequency-multiplied clock is in phase with the frequency-divided clock. The second clock thus has a frequency of about (5.00*n)MHz. n can have any value that is a natural integer. Note that as n increases, VPS signal of a higher frequency multiplied by the larger number n can be generated.

As previously explained, in accordance with the first embodiment of the present invention, the clock generating circuitry multiplies the frequency of the reference clock fsc by 2n and furnishes the frequency-multiplied clock as the first clock, divides the frequency of the frequency-multiplied clock by 227, and then multiplies the frequency of the frequency-divided clock by 128 and furnishes the frequency-multiplied clock as the second clock. Accordingly, the first embodiment offers the advantage of being able to generate the first and second clocks for video signal generation and VPS without having to use a voltage-controlled oscillator that oscillates at a very high frequency.

Second Embodiment

Figure 2:
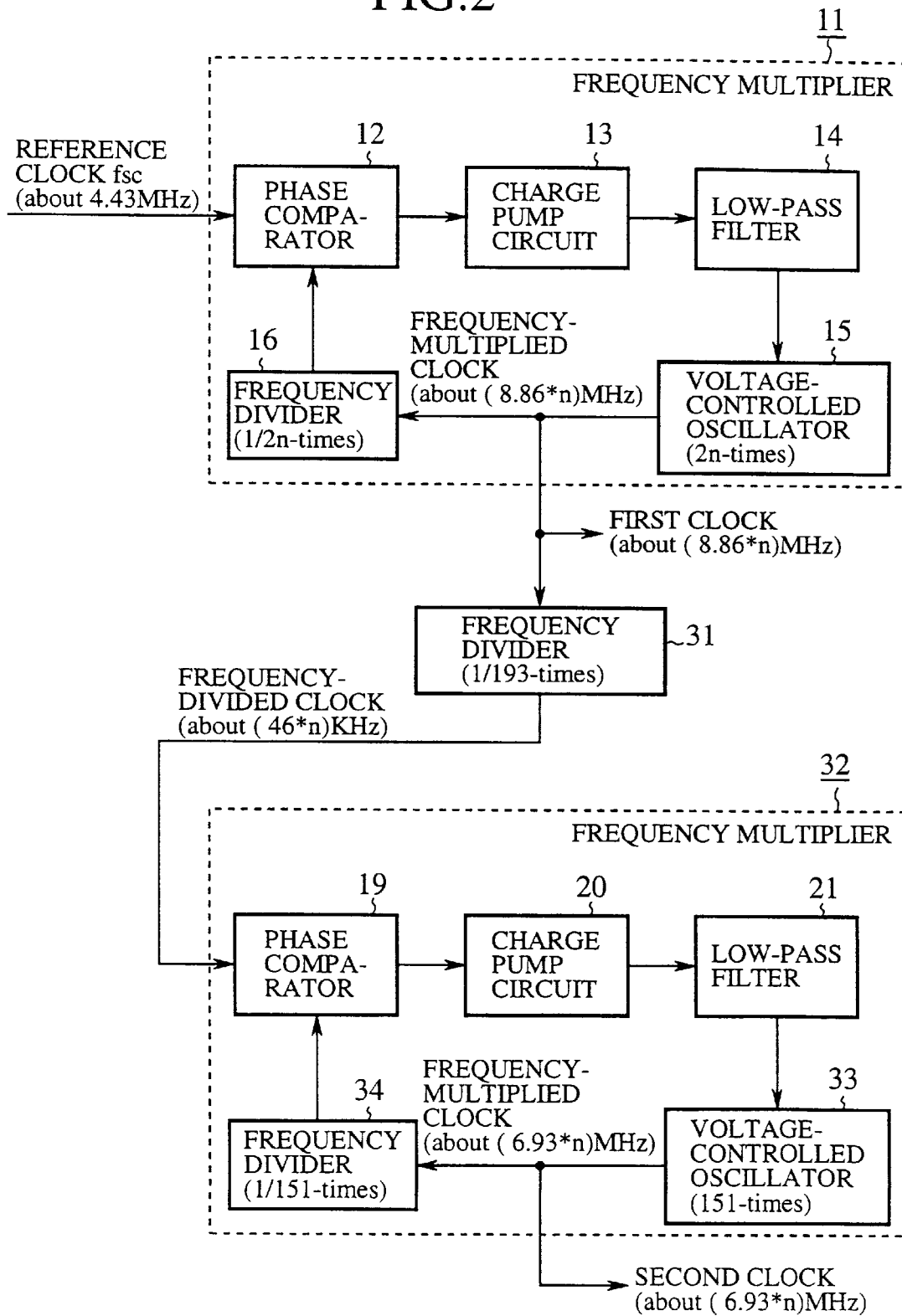
FIG. 2 is a block diagram showing the structure of clock generating circuitry according to a second embodiment of the present invention.
Figure 3:
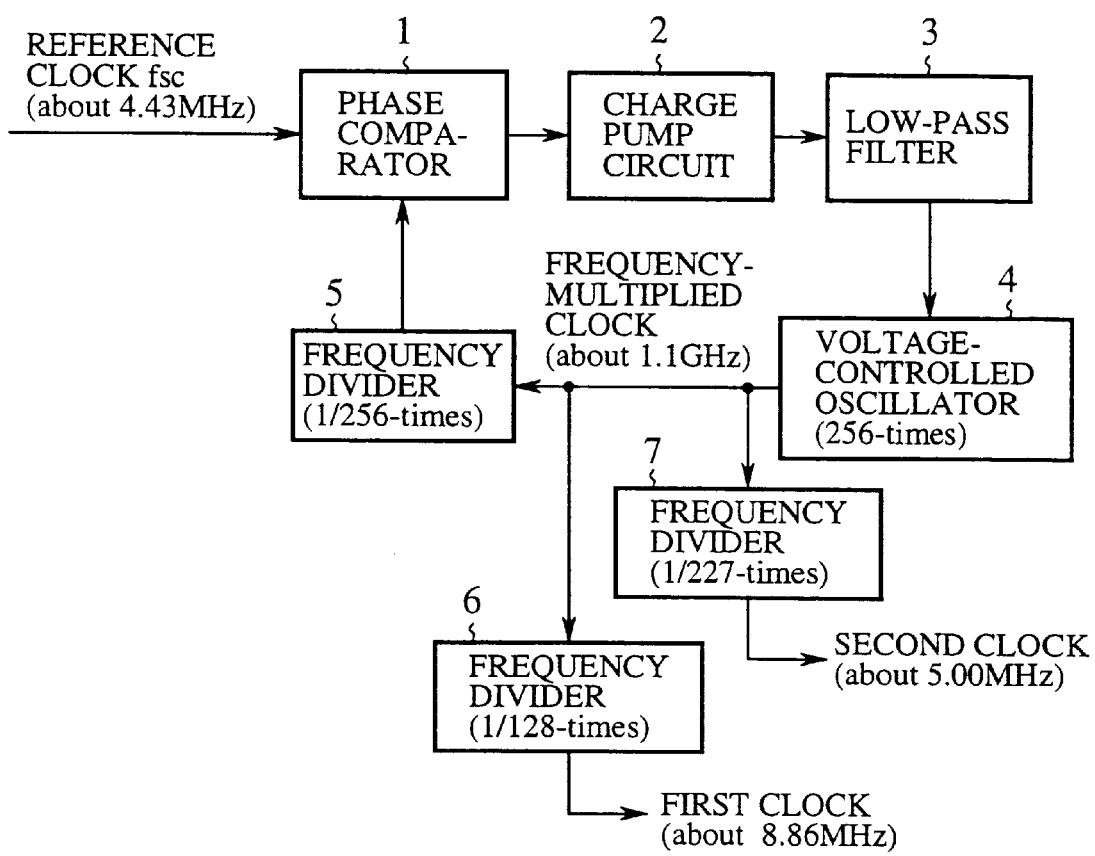
FIG. 3 is a block diagram showing the structure of prior art clock generating circuitry.

Referring next to FIG. 2, there is illustrated a block diagram showing the structure of clock generating circuitry according to a second embodiment of the present invention. In the figure, the same reference numerals as shown in FIG. 1 designate the same components as the clock generating circuitry of the first embodiment or like components, and therefore, the description of those components will be omitted hereinafter. In FIG. 2, reference numeral 31 denotes a second frequency divider for dividing the frequency of a frequency-multiplied clock furnished by a first frequency multiplier 11 by 193, and for furnishing the frequency-divided clock to a second frequency multiplier 32. The second frequency multiplier 32 multiplies the frequency of the frequency-divided clock from the second frequency divider 31 by 151 and then furnishes the frequency-multiplied clock as a second clock. The second frequency multiplier 32 includes a voltage-controlled oscillator 33 for generating the frequency-multiplied clock having a frequency proportional to an output potential from a low-pass filter 21, and a frequency divider 34 for dividing the frequency of the frequency-multiplied clock from the voltage-controlled oscillator 33 by 151 and for furnishing the frequency-divided clock to a phase comparator 19.

In operation, in the case that PAL is adopted as a television system, the clock generating circuitry according to the second embodiment of the present invention can generate a clock for video signal generation and another clock for TELETEXT (text broadcasting used in Europe), and the chrominance subcarrier for PAL whose frequency is about 4.43 MHz is used as the reference clock fsc.

To that end, the second frequency divider 31 divides the frequency of the frequency-multiplied clock from the first frequency multiplier by 193 and the voltage-controlled oscillator 33 of the second frequency multiplier multiplies the frequency of the frequency-divided clock by 151. The clock for TELETEXT needs to have a frequency 444 times (6.93 MHz) as high as the horizontal synchronizing signal (15.625 MHz). When n is set to 1 in the clock generating circuitry of the second embodiment, the voltage-controlled oscillator 33 of the second frequency multiplier can furnish the second clock whose frequency is equal to that of the clock for TELETEXT to outside the circuit. If n is set to 2 or more, the voltage-controlled oscillator 33 of the second frequency multiplier can generate the second clock whose frequency is n times as high as that of the clock for TELETEXT.

Many widely different embodiments of the present invention may be constructed without departing from the spirit and scope of the present invention. It should be understood that the present invention is not limited to the specific embodiments described in the specification, except as defined in the appended claims.

What is claimed is:

1. Clock generating circuitry comprising:

first frequency multiplying means for multiplying the frequency of a reference clock applied thereto by 2n, where n is a natural integer, and for outputting the frequency-multiplied clock as a first clock signal, said first frequency multiplying means having a first oscillator means for oscillating at a first frequency;

frequency dividing means for dividing the frequency of the frequency-multiplied clock output by said first frequency multiplying means by 227, and for outputting the frequency-divided clock; and second frequency multiplying means for multiplying the frequency of the frequency-divided clock from said frequency dividing means by 128, and for outputting the frequency-multiplied clock as a second clock signal, said second frequency multiplying means having a second oscillator means for oscillating at a second frequency which is less than said first frequency.

2. The clock generating circuitry according to claim 1, wherein said reference clock has a frequency of about 4.43 MHz.

3. Clock generating circuitry comprising:

first frequency multiplying means for multiplying the frequency of a reference clock applied thereto by 2n, where n is a natural integer, and for outputting the frequency-multiplied clock as a first clock signal, said first frequency multiplying means having a first oscillator means for oscillating at a first frequency;

frequency dividing means for dividing the frequency of the frequency-multiplied clock output by said first frequency multiplying means by 193, and for outputting the frequency-divided clock; and second frequency multiplying means for multiplying the frequency of the frequency-divided clock from said frequency dividing means by 151, and for outputting the frequency-multiplied clock as a second clock signal, said second frequency multiplying means having a second oscillator means for oscillating at a second frequency which is less than said first frequency.

4. The clock generating circuitry according to claim 3, wherein said reference clock has a frequency of about 4.43 MHz.

5. The clock generating circuitry according to claim 1, wherein said first clock signal is used as a reference clock for video signal generation.

6. The clock generating circuitry according to claim 3, wherein said first clock signal is used as a reference clock for video signal generation.

7. Clock generating circuitry comprising:

a first frequency multiplier for multiplying a frequency of a reference clock applied thereto by 2n, where n is a natural integer, and for outputting the frequency-multiplied clock as a first clock;

said first frequency multiplier including
a first frequency divider,
a first phase comparator for comparing a phase of the reference clock with that of a frequency-divided clock generated by the first frequency divider,
a first charge pump circuit for generating a pulse signal according to the comparison result from the first phase comparator,
a first low-pass filter for attenuating high-frequency components of said pulse signal from the first charge pump circuit, and
a first voltage-controlled oscillator for producing a frequency-multiplied clock of a certain frequency that is proportional to an output potential of the first low-pass filter,
said first frequency divider dividing the frequency of the frequency-multiplied clock from the first voltage-controlled-oscillator by 2n, and outputting the frequency-divided clock to the first phase comparator, a second frequency divider for dividing the frequency of the frequency-multiplied clock from the first frequency multiplier by 227, and for outputting the frequency-divided clock; and a second frequency multiplier for multiplying the frequency of the frequency-divided clock from the second frequency divider by 128 and for outputting the frequency-multiplied clock as a second clock, said second frequency multiplier including
a third frequency divider,
a second phase comparator for comparing the phase of the frequency-divided clock from the second frequency divider with that of a frequency-divided clock generated by the third frequency divider,
a second charge pump circuit for generating a pulse signal according to the comparison result from the second phase comparator,
a second low-pass filter for attenuating high-frequency components of the pulse signal from the second charge pump circuit, and
a second voltage-controlled oscillator for producing a frequency-multiplied clock of a certain frequency that is proportional to an output potential of the second low-pass filter.

8. The clock generating circuitry according to claim 7, wherein:

said second frequency divider divides the frequency of the frequency-multiplied clock from the first frequency multiplier by 193 and outputs the frequency-divided clock; and said second frequency multiplier multiplies the frequency of the frequency-divided clock from the second frequency divider by 151 and outputs the frequency-multiplied clock as a second clock.

* * * * *